United States Patent
Kotra

(10) Patent No.: US 6,518,809 B1
(45) Date of Patent: Feb. 11, 2003

(54) CLOCK CIRCUIT WITH SELF CORRECTING DUTY CYCLE

(75) Inventor: Prasad Rao Kotra, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/920,029

(22) Filed: Aug. 1, 2001

(51) Int. Cl.[7] ............................................. H03K 3/017
(52) U.S. Cl. ................ 327/175; 327/108; 327/291; 327/363; 331/40
(58) Field of Search ............................. 327/172–175, 327/176, 108, 112, 113, 114, 134, 135, 299, 363, 378, 387, 345, 155, 160, 233, 37; 331/40, 177 R; 375/238, 241

(56) References Cited

U.S. PATENT DOCUMENTS

| | | | |
|---|---|---|---|
| 4,071,781 A | 1/1978 | Kayalioglu | 327/165 |
| 4,239,992 A | 12/1980 | Perkins | 327/175 |
| 4,277,697 A | 7/1981 | Hall et al. | 327/175 |
| 4,330,751 A | 5/1982 | Swain | 327/114 |
| 4,355,283 A | 10/1982 | Ott | 327/172 |
| 4,461,962 A | 7/1984 | Hacke et al. | 327/175 |
| 4,479,216 A | 10/1984 | Krambeck et al. | 714/814 |
| 4,527,075 A | 7/1985 | Zbinden | 327/175 |
| 4,736,118 A | 4/1988 | Fischer | 327/175 |
| 4,799,022 A | 1/1989 | Skierszkan | 327/116 |
| 4,959,557 A | 9/1990 | Miller | 327/175 |
| 5,231,320 A | 7/1993 | Kase | 327/277 |
| 5,315,164 A | 5/1994 | Broughton | 327/175 |
| 5,477,180 A * | 12/1995 | Chen | 327/108 |
| 5,481,228 A | 1/1996 | Badyal | 331/74 |
| 5,572,158 A | 11/1996 | Lee et al. | 327/175 |
| 5,757,218 A | 5/1998 | Blum | 327/175 |
| 5,856,753 A | 1/1999 | Xu et al. | 327/175 |
| 5,920,217 A | 7/1999 | Mellot | 327/175 |
| 5,945,857 A | 8/1999 | Havens | 327/175 |
| 6,040,726 A | 3/2000 | Martin | 327/175 |
| 6,060,922 A * | 5/2000 | Chow et al. | 327/175 |
| 6,121,805 A | 9/2000 | Thamsirianunt et al. | 327/175 |
| 6,169,434 B1 | 1/2001 | Portmann | 327/175 |
| 6,181,178 B1 | 1/2001 | Choi | 327/175 |
| 6,285,226 B1 | 9/2001 | Nguyen | 327/175 |
| 6,320,437 B1 * | 11/2001 | Ma | 327/153 |
| 6,320,438 B1 * | 11/2001 | Arcus | 327/165 |
| 6,326,827 B1 | 12/2001 | Cretti et al. | 327/175 |

OTHER PUBLICATIONS

"ASMD With Duty Cycle Correction Scheme For High–Speed DRAM", By Seong–Jun Jang, et al., Electronics Letter, Aug. 2nd, 2001, vol. 37, No. 16, pp. 1004–1006.

"Pulsewidth Control Loop in High–speed CMOS Clock Buffers", By Fenghao Mu et al., IEEE Transactions on Solid State Circuits, vol. 35, No. 2, Feb. 2000, pp. 134–141.

"A Low Jitter Dual Loop DLL Using Multiple VCDLS With a Duty Cycle Corrector", By Yeon–Jae Jun. et al., 2000 Symposium on VLSI Circuits Digest of Technical Papers,, pp. 50–51.

"A CMOS 50% Duty Cycle Repeater Using Complementary Phase Blending", By Kazuyuki Nakamura et al., 2000 Symposium on VLSI Circuits Digest of Technical Papers, pp. 48–49.

"Duty Cycle Control Circuit and Applications to Frequency Dividers", By Hwang–Cherng Chow, 1999 IEEE, pp. 1619–1622.

"A Simple Precharged CMOS Phase Frequency Detector", By Henrik O. Johansson, IEEE Journal of Solid–State Circuits, vol. 33, No. 2, Feb. 1998, pp. 295–299.

* cited by examiner

*Primary Examiner*—Timothy P. Callahan
*Assistant Examiner*—Minh Nguyen
(74) *Attorney, Agent, or Firm*—Christopher P. Maiorana, P.C.

(57) ABSTRACT

An apparatus including a driver and an adjustment circuit. The driver circuit may be configured to generate an output signal in response to a clock input signal and an adjustment signal. The adjustment circuit may be configured to generate the adjustment signal in response to the output signal. The adjustment signal may be configured to correct a duty cycle of the output signal.

18 Claims, 4 Drawing Sheets

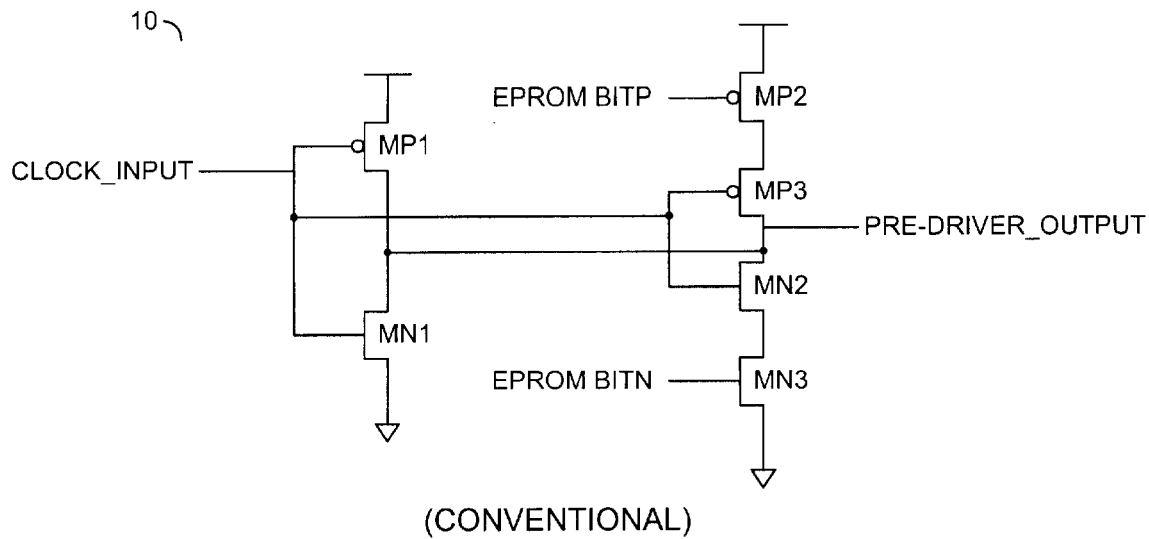
(CONVENTIONAL)
FIG. 1
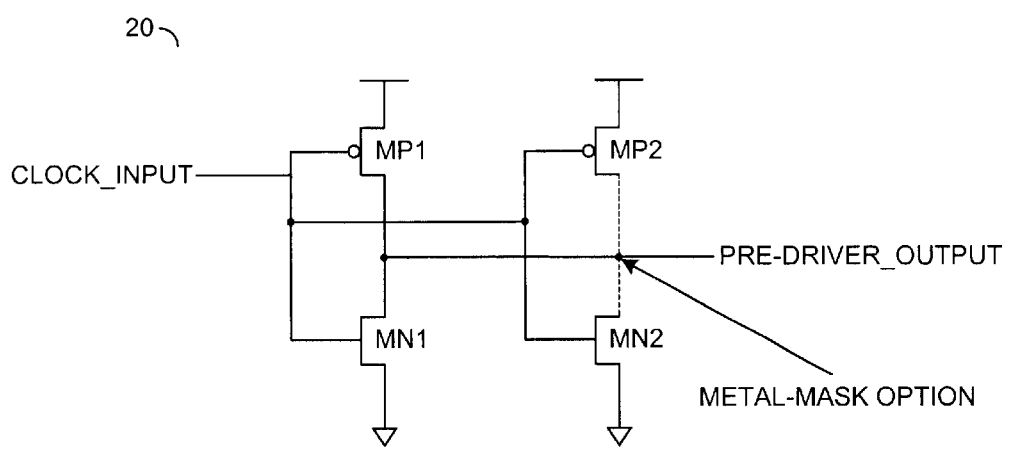
(CONVENTIONAL)
FIG. 2

CLOCK CIRCUIT WITH SELF CORRECTING DUTY CYCLE

FIELD OF THE INVENTION

The present invention relates to a method and/or architecture for the generation of clock signals, and more particularly, to a method and/or architecture for correcting the duty cycle of an output clock signal.

BACKGROUND OF THE INVENTION

Digital electronic circuits and systems rely on clock signals to ensure correct operation. A clock signal transitions from a low voltage potential to a high voltage potential and remains at the high voltage potential for a fixed period of time. The clock signal then transitions to the low voltage potential and remains at the low voltage potential for another fixed period of time. One cycle of high time and low time forms a complete clock cycle. The duty cycle of a clock signal is defined as the ratio of the high time versus the total period (i.e., total period=high time+low time) during a clock cycle. Typically, clock signals have a target duty cycle of 50% (i.e., the high period and the low period should be equal in duration).

In PLL based clock chips, the duty cycle will be degraded at the higher end of the frequency range since there are no dividers between VCO outputs and driver inputs. Therefore, the VCO duty cycle (typically between 49% to 51%) is passed to the drivers. Additionally, the driver will introduce 2–3% duty cycle degradation. The output clock signal will have duty cycle variation of 46% to 54% or even higher.

Referring to FIG. 1, a duty cycle correction circuit 10 based on programming adjustment values in an on-chip memory is shown. The clock signal CLOCK_INPUT is typically a clock signal having a desirable frequency for the clock output signal PRE-DRIVER_OUTPUT. The clock signal CLOCK_INPUT will have a duty cycle close to 50%. However, for higher speed clock frequencies, generation of an accurate duty cycle is difficult. In high frequency implementations, the clock signal CLOCK_INPUT is generated by a phase locked loop (PLL) that has a variable duty cycle (i.e., 45% to 55%). The transistors MP1, MN1, MP3 and MN2 are driven by the clock signal CLOCK_INPUT, while the transistors MP2 and MN3 are each driven by a separate value stored in the memory (i.e., EPROM bit P and EPROM bit N). The on-chip memory is typically an electronically programmable read only memory (EPROM).

The EPROM duty cycle correction circuit 10 has substantial costs. The circuitry required to write, read and perhaps latch the EPROM bit values P and N can occupy considerable chip area. The circuitry also adds considerable complexity, design and debug considerations. Furthermore, individually testing and programming of the circuit 10 requires considerable time and cost during the manufacturing process.

Referring to FIG. 2, a duty cycle correction circuit 20 based on programming adjustment values in metal mask operations is shown. The clock signal CLOCK_INPUT drives the gates of PMOS type pull up transistor MP1 and (optionally) of the PMOS type pull up transistor MP2. The clock signal CLOCK_INPUT also drives the gates of the NMOS type pull down transistor MN1 and of (optionally) the NMOS type pull down transistor MN2. The adjusted clock signal PRE_DRIVER_OUTPUT results from the pull up action of transistor MP1 (and of the transistor MP2 if the metal mask programming option is selected) working against the pull down action of transistor MN1 (and of the transistor MN2 if the metal mask programming option is selected). The circuit 20 provides three correction options (i) no duty cycle correction, (ii) one step of positive duty cycle correction and (iii) one step of negative duty cycle correction. Since the duty cycle adjustment of the circuit 20 is applied at fabrication, each Integrated Circuit (IC) requires the same correction to be applied during fabrication.

The typical duty cycle correction circuits 10 and 20 have drawbacks. For example, the threshold adjust of the pre-driver is done by adding extra legs in the pullup or pulldown path using EPROM bits or metal masks. Therefore, the duty correction circuits 10 and 20 do not address duty cycle degradation due to process spread.

SUMMARY OF THE INVENTION

The present invention concerns an apparatus comprising a driver and an adjustment circuit. The driver circuit may be configured to generate an output signal in response to a clock input signal and an adjustment signal. The adjustment circuit may be configured to generate the adjustment signal in response to the output signal. The adjustment signal may be configured to correct a duty cycle of the output signal.

The objects, features and advantages of the present invention include providing a method and/or architecture for correcting a duty cycle of a system clock signal that may (i) provide self-correcting duty cycle adjustment, (ii) provide an on-chip implementation, (iii) minimize duty cycle variations due to process spread, (iv) control a tunable pre-driver circuit, (v) reduce testing time, (vi) not require a non-volatile memory, thereby reducing cost and/or (vii) sense an output duty cycle of a driver to provide correction.

BRIEF DESCRIPTION OF THE DRAWINGS

These and other objects, features and advantages of the present invention will be apparent from the following detailed description and the appended claims and drawings in which:

FIG. 1 is a schematic of a typical EPROM duty cycle correction circuit;

FIG. 2 is a schematic of a typical metal mask duty cycle correction circuit;

DETAILED DESCRIPTION OF THE PREFERRED EMBODIMENTS

The present invention may act as a second level of duty cycle correction (e.g., a first level duty cycle correction may be done within typical PLL circuits). The second level of duty cycle correction may be provided by sensing an output duty cycle. The present invention may generate control bits to adjust a threshold of a pre-driver circuit by enabling (or disabling) tunable pullup and pulldown control signals. The control bits may be generated based on the output duty cycle. Additionally, the present invention may utilize start-up times of clock generation circuits to provide duty cycle correction. For example, once PLL lock is achieved, a reset signal may be disabled to start duty cycle correction.

Figure 3:
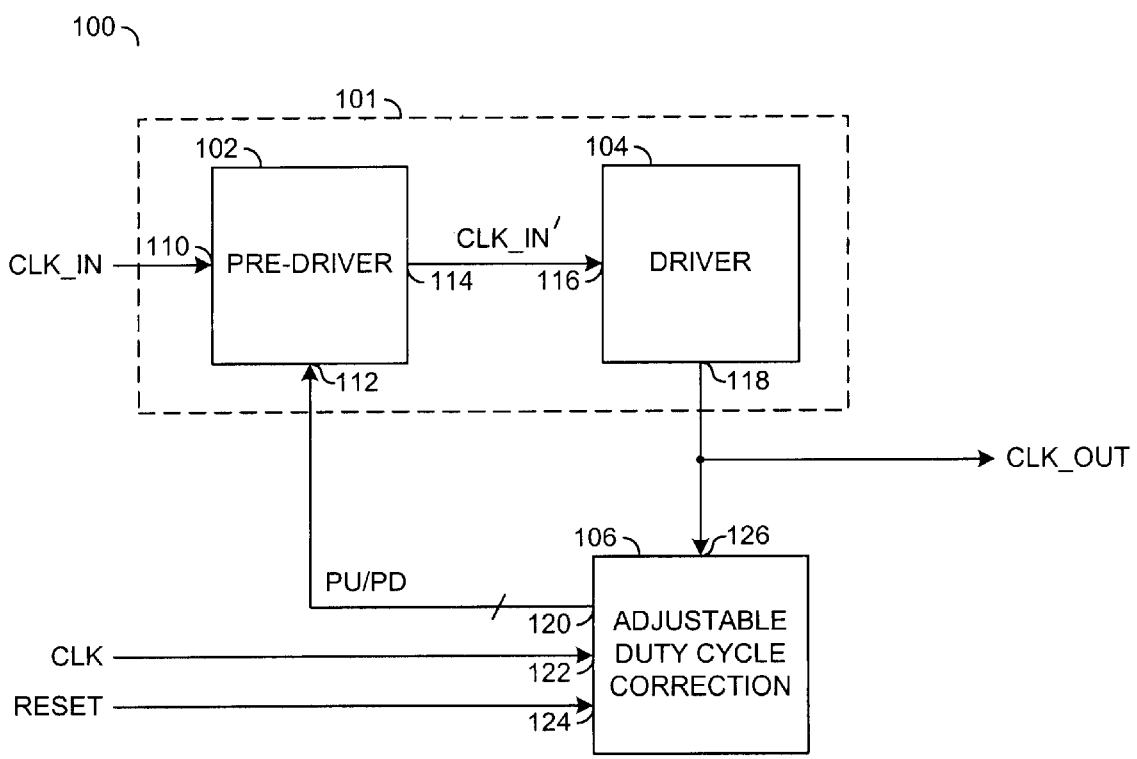
FIG. 3 is a block diagram of an exemplary implementation of the present invention.

Referring to FIG. 3, a device (or circuit) 100 illustrating an exemplary implementation of the present invention is shown. The circuit 100 generally comprises a block (or circuit) 101 and a block (or circuit) 106. The circuit 101 may be implemented as a driver block. The circuit 101 generally comprises a block (or circuit) 102 and a block (or circuit) 104. The circuit 102 may be implemented as a pre-driver circuit. The circuit 104 may be implemented as a driver circuit. The circuit 106 may be implemented as an adjustable duty cycle correction circuit. The pre-driver 102 may have an input 110 that may receive a signal (e.g., CLK_IN), an input 112 that may receive a signal (e.g., PU/PD) and an output 114 that may present a signal (e.g., CLK_IN'). The driver 104 may have an input 116 that may receive the signal CLK_IN' and an output 118 that may present a signal (e.g., CLK_OUT). The circuit 106 may have an output 120 that may present the signal PU/PD, an input 122 that may receive a signal (e.g., CLK), an input 124 that may receive a signal (e.g., RESET) and an input 126 that may receive a signal (e.g., CLK_OUT). The signal PU/PD may be implemented as an adjustment signal. The signal PU/PD may be implemented as one or more multi-bit or single-bit control signals. The adjustable duty cycle correction circuit 106 may be configured to control the pre-driver 102 via the adjustment signal PU/PD. The circuit 106 may generate the signal PU/PD in response to the signal CLK_OUT.

Figure 4:
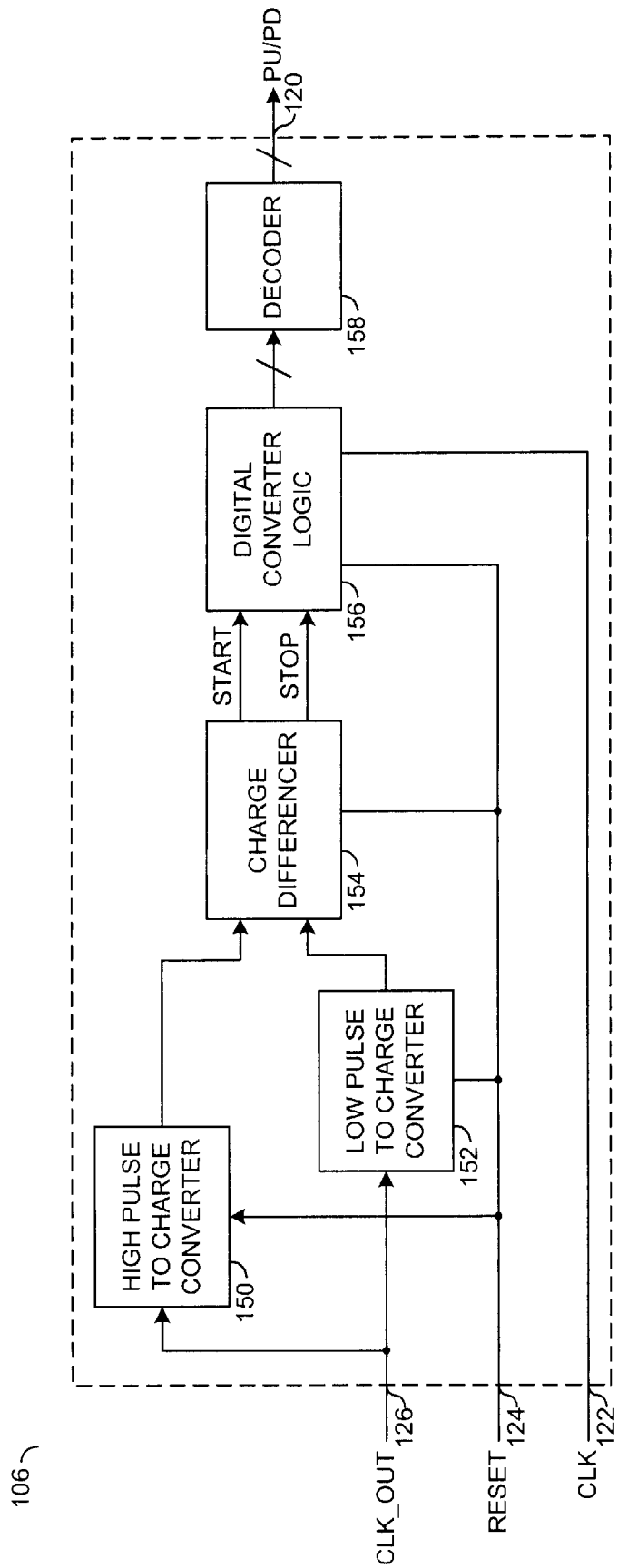
FIG. 4 is a block diagram illustrating a preferred embodiment of the present invention.

Referring to FIG. 4, the circuit 106 is shown comprising a converter 150, a converter 152, a charge difference circuit 154, a digital converter 156 and a decoder 158. The circuit 106 may be configured to automatically monitor and adjust a duty cycle of the output clock signal CLK_OUT. The circuit 100 may be configured to self correct (e.g., via the adjustable duty cycle correction circuit 106) the duty cycle of the signal CLK_OUT.

The circuit 150 may be implemented as a high pulse to charge potential converter circuit. The circuit 152 may be implemented as a low pulse to charge potential converter circuit. The circuits 150 and 152 may receive the signal CLK_OUT and the signal RESET. The circuits 150 and 152 may each present a signal to the charge difference circuit 154. The charge difference circuit 154 may also receive the signal RESET, present a signal (e.g., START) and present a signal (e.g., STOP). The digital converter logic circuit 156 may receive the signals START and STOP, the signal RESET and the signal CLK. The digital converter logic circuit 156 may present a multi-bit signal to the decoder 158. The decoder 158 may be configured to generate the signal PU/PD.

Once the signal RESET is deasserted, the converter circuits 150 and 152 may start accumulating charge. The charge accumulation by the converter circuits 150 and 152 may be uneven if the duty cycle of the signal CLK_OUT deviates from 50%. The charge differencer 154, the digital converter logic 156 and the decoder 158 may be implemented to generate the control signals PU/PD for the tunable pre-driver 102.

The output of the digital logic circuit 156 may be compared with a predetermined count value using a digital comparator (not shown, within the decoder 158). The output of digital comparator may depict the amount of duty cycle correction and necessity of duty cycle correction iteration. The number of itertions may be decided by a state machine (not shown, within the decoder 158) that may be controlled by the output of the digital comparator. In order to avoid toggling between under correction and over correction, the circuit 106 may have a fixed number of iterations before making a correction.

The circuit 106 may improve the duty cycle of the clock signal CLK_OUT. The circuit 106 may be implemented with digital logic, involving sequential logic validating set-up and hold times.

Figure 5:
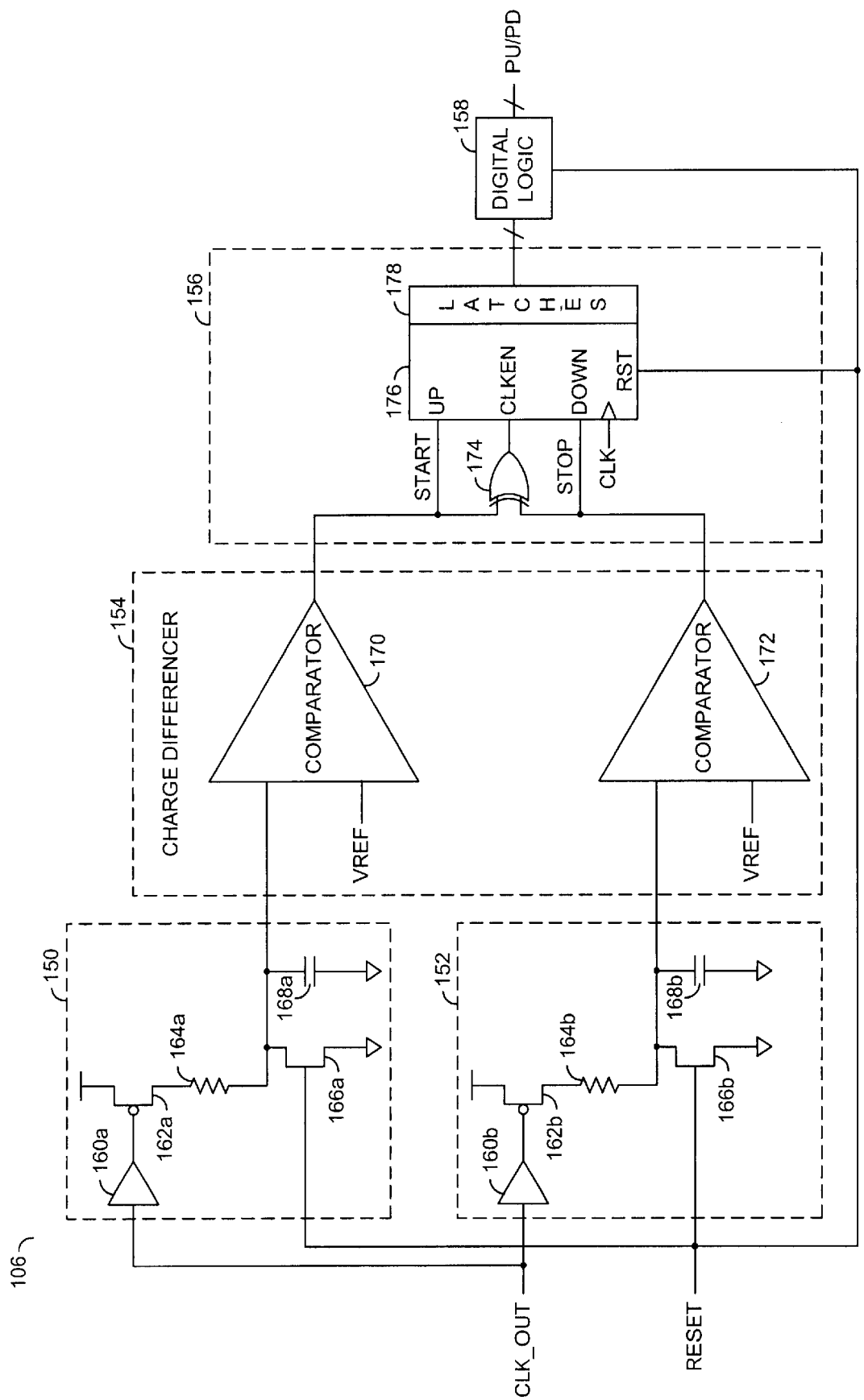
FIG. 5 is a detailed block diagram of the circuit of FIG. 4.

Referring to FIG. 5, a more detailed diagram of the circuit 106 is shown. The circuit 150 generally comprises a buffer 160, a transistor 162, a resistor 164, a transistor 166 and a capacitor 168. The circuit 152 (of which the components are marked with the suffix b) may be similar to the circuit 150 (of which the components are marked with the suffix a). However, the buffer 160b may be implemented as an inverter. The circuit 154 generally comprises a comparator 170 and a comparator 172. The circuit 156 generally comprises a gate 174, a counter 176 and a latch device 178. The latch device 178 may comprise a variable number of latches.

The clock output CLK_OUT may drive buffer 160a and the invertered buffer 160b. The transistor 162a, when active, may provide a pulse to charge the capacitor 168a and the comparator 170. The transistor 162b, when active, may provide a pulse to charge the capacitor 168b and the comparator 172. The transistor 162a may be active on a low transaction of the clock CLK_OUT. Each capacitance 168 may accumulate charge when the transistor 162 is active, respectively. Thus, the voltages presented to the charge difference circuit 154 may indicate a total duration of the high and the low pulse on the signal CLK_OUT, respectively.

The comparators 170 and 172 may receive the charge potentials and convert them into a digital indication of the duty cycle deviation (e.g., the signals START and STOP). The output of each comparator 170 and 172 may transition when the voltage on the capacitance 168, associated with the comparator 170 or 172, reaches a reference voltage (e.g., VREF). The voltage VREF may be generated by a voltage divider circuit.

If the duty cycle of the signal CLK_OUT is 50%, then both duty cycle indication signals START and STOP may transition substantially simultaneously. If the duty cycle is not 50%, then one of the duty cycle indication signals START or STOP may transition. The signal STOP may indicate if the duty cycle is higher than 50%. The signal START may indicate if the duty cycle is lower than 50%. The length of time difference that the duty cycle indication signals START and/or STOP may indicate an amount of deviation from the target duty cycle of 50%.

When the duty cycle of the clock CLK_OUT deviates from 50%, either the signal START or the signal STOP may be enabled (e.g., logic high). The initial active signal START or STOP may cause the up/down counter 176 to either count up or down. A magnitude of the count value may be proportional to the deviation from 50%. When the duty cycle is less than 50% (e.g., HIGH period is shorter than LOW period) the counter 176 may count up and when the duty cycle is greater than 50% (e.g., HIGH period is longer than LOW period) the counter 176 may count down. The count value may then be stored within the digital converter logic 156 when both of the signals START and STOP attain logic high state. When both of the signals START and STOP reach an active high state, an iteration of duty cycle correction may be complete.

In an alternate embodiment of the present invention, where the target duty cycle has a value other than 50%, each of comparators 170 and 172 may implement other voltage reference values, where the difference between the voltage reference values may control the duty cycle ratio.

The signal RESET may discharge the capacitors 168 via the transistors 166 to ensure the charge accumulation starts from a ground potential when a clock generation circuit (not shown) is first powered up. The signal RESET may be particularly useful when iterative duty cycle adjustment is needed.

The duty cycle indication signals START and STOP may direct the up/down counter 176 to count up when the duty cycle signal START is active and down when the duty cycle signal STOP is active. The XOR gate 174 may enable the up/down counter 176. The up/down counter 176 may count up when the duty cycle is skewed in a particular direction and count down when the duty cycle is skewed in another particular direction. The magnitude of a value of the counter 176 may indicate a magnitude by which the duty cycle departs from the target duty cycle of 50%. The magnitude value may be latched by the latches 178. The latches 178 may be optional components. However, iterative duty cycle adjustment may implement use of the latches 178.

The digital logic 158 may convert the count of the up/down counter 176 into the adjustment signal PU/PD as shown in the following TABLE 1:

TABLE 1

| Final Count | Pull up control #1 | Pull up control #2 | Pull down control #1 | Pull down control #2 |
|---|---|---|---|---|
| >32 | Enabled | Enabled | Disabled | Disabled |
| >16 and < = 32 | Disabled | Enabled | Disabled | Disabled |
| >6 and < = 16 | Enabled | Disabled | Disabled | Disabled |
| < = 6 and > = −6 | Disabled | Disabled | Disabled | Disabled |
| < −6 and > = −16 | Disabled | Disabled | Enabled | Disabled |
| < −16 and > = −32 | Disabled | Disabled | Disabled | Enabled |
| < −32 | Disabled | Disabled | Enabled | Enabled |

TABLE 1 may illustrate a decoding conversion from duty cycle indication to adjustment signal operation.

The iterative approach may be configured to fine tune the duty cycle adjustment. For example, when the system reset (e.g., the signal RESET) is first enabled, the latches 178 may be zeroed, the value in the up/down counter 176 may be cleared and any charge accumulated on capacitors 168 may be removed.

The pulse to charge converters 150 and 152 may then start monitoring the duty cycle of clock output CLK_OUT. One of the comparators 170 or 172 may transition and start the up/down counter 176. The other comparator 170 or 172 may then transition and stop the up/down counter 176. The final value (e.g., accumulated magnitude) of the up/down counter 176 may then be latched in the latches 178. The digital logic 158 may then generate the adjustment signal PU/PD in response to the final value. The circuit 100 may start operating on the adjustment via the signal PU/PD.

Under the control of an iteration state machine (not shown), the reset signal RESET may be re-asserted, thus initiating the adjustment process. Each time another iteration starts the correction previously determined may be applied. Each iteration may proceed as described. However, each new final value of the up/down counter 176 may be taken into account along with the previous value latched in the latches 178. The adjustable duty cycle correction circuit 106 may therefore produce a fine tuning effect. Alternatively, adjustment may be terminated after a predetermined number of iterations, such that the duty cycle does not wobble between slightly over corrected and slightly under corrected situations.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a driver circuit configured to generate an output signal in response to a clock input signal and an adjustment signal, wherein said driver circuit comprises (i) a pre-driver circuit configured to generate a pre-driven clock signal and control a pre-driver duty cycle of said pre-driven clock signal in response to said adjustment signal, and (ii) a driver configured to generate said output signal in response to said pre-driven clock signal; and an adjustment circuit configured to generate said adjustment signal in response to said output signal, wherein said adjustment circuit comprises (i) a first converter configured to convert a high pulse of said output signal to a first charge potential, (ii) a second converter configured to convert a low pulse of said output signal to a second charge potential, and (iii) a charge difference circuit configured to generate a first control signal in response to said first charge potential and a second control signal in response to said second charge potential and said adjustment signal is configured to correct a duty cycle of said output signal.

2. The apparatus according to claim 1, wherein said adjustment circuit comprises an automatic duty cycle correction circuit.

3. The apparatus according to claim 1, wherein said driver is further configured to perform a first duty cycle correction and a second duty cycle correction, wherein said second duty cycle correction is performed in response to said adjustment signal.

4. The apparatus according to claim 1, wherein said adjustment circuit is further configured to control a correction of an input duty cycle of said clock input signal.

5. The apparatus according to claim 4, wherein said adjustment circuit is further configured to sense said duty cycle of said output signal.

6. The apparatus according to claim 5, wherein said adjustment circuit is further configured to correct said input duty cycle in response to said duty cycle of said output signal.

7. The apparatus according to claim 1, wherein said adjustment circuit is configured to minimize duty cycle variation due to process spread.

8. The apparatus according to claim 1, wherein said adjustment signal comprises a pump up signal and a pump down signal.

9. The apparatus according to claim 1, wherein said adjustment circuit is further configured in response to a reset signal, wherein said reset signal is configured to start and stop duty cycle correction of said adjustment circuit.

10. The apparatus according to claim 1, wherein said adjustment circuit comprises:

a digital logic circuit configured to receive said first and second control signals and generate a predecoded signal; and a decoder configured to receive said predecoded signal and generate said adjustment signal, wherein said adjustment signal is configured to control said driver circuit.

11. The apparatus according to claim 10, wherein:

said first and second converters each comprise (i) a buffer coupled to a gate of a first transistor, (ii) said first transistor, a second transistor and a resistor coupled in series and (iii) a capacitor coupled in parallel with said second transistor ;

said charge difference circuit comprises a first comparator configured to receive said first charge potential and present said first control signal and a second comparator configured to receive said second charge potential and present said second control signal; and said digital logic circuit comprises a counter configured to count in response to said first and second control signals and a number of latches coupled to said counter and configured to present said predecoded signal.

12. The apparatus according to claim 10, wherein said first and second control signals are configured to adjust for a duty cycle greater than a predetermined value and a duty cycle less than said predetermined value.

13. An apparatus comprising:

means for generating an output signal in response to a clock input signal and an adjustment signal;

means for generating said adjustment signal in response to said output signal, wherein said adjustment signal generating means comprises means for (i) converting a high pulse of said output signal to a first charge potential, (ii) converting a low pulse of said output signal to a second charge potential, and (iii) generating a first control signal in response to said first charge potential and a second control signal in response to said second charge potential; and means for correcting a duty cycle of said output signal in response to said adjustment signal.

14. A method for automatic duty cycle correction, comprising the steps of:

(A) generating (i) an output signal in response to a clock input signal and an adjustment signal, (ii) a pre-driven clock signal in response to said clock input signal and said adjustment signal, and (iii) said output signal in response to said pre-driven clock signal;

(B) generating said adjustment signal in response to said output signal by (i) converting a high pulse of said output signal to a first charge potential, (ii) converting a low pulse of said output signal to a second charge potential, and (iii) generating a first control signal in response to said first charge potential and a second control signal in response to said second charge potential; and (C) correcting a duty cycle of said output signal in response to said adjustment signal.

15. The method according to claim 14, wherein step (A) further comprises:

performing a first duty cycle correction; and performing a second duty cycle correction in response to said adjustment signal.

16. The method according to claim 14, wherein step (B) further comprises:

sensing said duty cycle of said output signal.

17. The method according to claim 14, wherein step (C) further comprises:

minimizing duty cycle variation due to process spread.

18. The method according to claim 14, wherein said adjustment signal comprises a pump up signal and a pump down signal.

* * * * *